(12) United States Patent
Suenaga et al.

(10) Patent No.: US 6,370,897 B1
(45) Date of Patent: Apr. 16, 2002

(54) SEMICONDUCTOR MANUFACTURING FACILITY

(75) Inventors: Osamu Suenaga, Koufu (JP); Tadahiro Ohmi, 1-17-301, Komegafukuro 2-Chome, Aoba-Ku, Sendai, Miyagi 980-0813 (JP); Sadao Kobayashi, Yokohama (JP)

(73) Assignees: Tokyo Electron Limited, Tokyo (JP); Tadahiro Ohmi, Miyagi (JP); Taisei Corporation, Tokyo (JP)

(*) Notice: Subject to any disclaimer, the term of this patent is extended or adjusted under 35 U.S.C. 154(b) by 0 days.

(21) Appl. No.: 09/670,343

(22) Filed: Sep. 27, 2000

Related U.S. Application Data

(63) Continuation of application No. PCT/JP00/04312, filed on Jun. 29, 2000.

(30) Foreign Application Priority Data

Jul. 2, 1999 (JP) .................................... 11-189747

(51) Int. Cl.[7] .................... F25B 27/00; F28D 15/00
(52) U.S. Cl. ................... 62/238.1; 165/104.33
(58) Field of Search ............. 62/238.1, 79; 165/104.33, 165/80.4

(56) References Cited

FOREIGN PATENT DOCUMENTS

| JP | 02308558 A | * 12/1990 |
| JP | 7-24295 | 1/1995 |
| JP | 7-284675 | 10/1995 |
| JP | 09246363 A | * 9/1997 |
| JP | 9-251959 | 9/1997 |
| JP | 3061067 | 6/1999 |

* cited by examiner

Primary Examiner—Denise L. Esquivel
Assistant Examiner—Chen-Wen Jiang
(74) Attorney, Agent, or Firm—Pillsbury Winthrop LLP

(57) ABSTRACT

A cooling jacket unit (5) is provided to a periphery of a heating furnace of a heat treatment apparatus. A cooling unit has a double water jacket comprising an inner fluid passage (51) and an outer fluid passage (52), and cooling water supplied to the outer fluid passage exits from the inner fluid passage. The temperatures of the inlet port and the outlet port of the cooling jacket unit (5) are set to, for example, 40° C. and 85° C., respectively, and the cooling water (warmed exhaust water) from the outlet port is supplied to a heat recovery part (2). Heat is recovered from the cooling water by the heat recovery part (29, and the recovered heat is reused for heating a boiler water and the like. The warmed exhaust water from which the heat is recovered is supplied again to the cooling jacket unit (5) as the cooling water.

10 Claims, 13 Drawing Sheets

SEMICONDUCTOR MANUFACTURING FACILITY

This application is a continuation of PCT/JP 00/04312 filed Jun. 29, 2000.

TECHNICAL FIELD

The present invention relates to semiconductor manufacturing facilities and, more particularly, to a semiconductor manufacturing facility having a heat recovery apparatus, which recovers heat generated by semiconductor manufacturing equipment.

BACKGROUND ART

In a semiconductor manufacturing plant, boilers and refrigerating machines are installed so as to serve as cold heat sources for air conditioning. In order to attempt energy conservation in the semiconductor manufacturing plant, it is required to reduce operation loads of the boilers and the refrigerating machines. For example, it is considered to use a method of saving a power consumed by a refrigerating machine by reducing a load to the refrigerating machine, which supplies a refrigerating medium to a dry coil, by reducing an amount of air supplied to a clean room or reducing an amount of air circulating in the clean room so as to reduce an amount of heat removed by the dry coil to cool the air circulating in the clean room. However, this method has a problem in that the temperature of the clean room cannot be adjusted in a case in which the temperature of the clean room is increased due to heat generated by semiconductor manufacturing equipment.

In the conventional class 10 clean room (particle diameter of 0.1 μm), the number of circulations is 100 times per one hour. The reason for such a large number of circulations is not only to remove dust but also to maintain the temperature of the clean room at 23° C. That is, it is necessary to remove heat by the heat exchange in the dry coil. If the number of times of the circulation is reduced, the temperature fluctuation in the clean room may not be controlled under certain operating conditions of the semiconductor manufacturing apparatus. As a result, there also is a problem in that an yield rate of the products is decreased since the dimensional deviation of machining is increased due to a temperature change of the semiconductor manufacturing equipment which needs a temperature control due to its property.

Accordingly, in view of saving the air conditioning energy in the semiconductor manufacturing plant, it is preferable for the conventional facility to increase the setting temperature of the clean room as high as possible. However, an environment of a temperature exceeding 23° C. is an operating environment in which a worker wearing clean clothes in the clean room feels hot. Additionally, natrium or ammonium is generated due to sweating of the worker, which may deteriorate the working environment. Accordingly, in view of the working environment, it is not preferable to increase the setting temperature of the clean room to a temperature above 23° C.

In view of the above mentioned, it is said that the method of reducing the number of times of circulation in the clean room or a method of increasing the setting temperature of the clean room is not a decisive plan to achieve the energy saving.

A description will now be given of a conventional apparatus for cooling the semiconductor manufacturing equipment. FIG. 1A is a perspective view of a single coil cooing pipe 10 conventionally used to cool a heating furnace (specifically, a heat generating part thereof) of the semiconductor manufacturing equipment. FIG. 1B is a front view of the cooling pipe 10. The cooling pipe 10 is wound on the periphery of the semiconductor manufacturing equipment, and cooling water is supplied to a lower cooling water inlet port 11. The cooling water flows through a coil portion, and exit from an upper cooling water outlet port 12. Release of heat to outside (inside the clean room) is suppressed by the cooling water recovering the heat of the semiconductor manufacturing equipment.

The temperature of the cooling water supplied to the cooling water inlet port 11 is maintained at about 23° C., which is a setting temperature of a clean room so that dew formation does not occur. The temperature of the cooling water exiting from the cooling water outlet port 12 normally ranges from about 25° C. to 28° C. although the temperature varies according to the operating conditions. That is, a temperature difference between the cooling water inlet port 11 and the outlet port 12 is about 5° C.

A description will now be given, with reference to FIG. 2, of a cooling system of the cooling water supplied to the cooling pipe 10. Cold water of about 6° C., which is cooled by a refrigerating machine 101, is temporarily stored in a cold-water tank 102, and is delivered to a heat exchanger 103. The cold water delivered to the heat exchanger 103 cools the cooling water to be supplied to the coil-type cooling pipe 10, and, thereafter, returned to the cold-water tank 102. On the other hand, the cooling water stored in a buffer tank 104, which has a temperature higher than 23° C., is delivered to the heat exchanger 103 by a water pump 105, and is cooled to the temperature of 23° C. by exchanging heat with the cold water of 6° C. The cooling water enters the inlet port 11 of the coil-type cooling pipe 10, passes through the cooling pipe 10 and exits from the outlet port 12 so as to be returned to the buffer tank 104. It should be noted that, in FIG. 2, 106 indicates a cooling tower, 107 indicates a temperature sensor, and 108–110 indicate water pumps.

In the above-mentioned cooling apparatus, since the temperature at the outlet port of the cooling pipe 10 is as low as below 30° C., a temperature difference between the air or water with which heat is exchanged is small. Accordingly, the heat exchange efficiency is low, and the cooling water was not able be used for heat recovery. Additionally, since the temperature of the cooling water supplied to the cooling pipe 10 is set to the setting temperature of 23° C. of the clean room, the cooling water of a separate system must be controlled to about 23° C. by heat exchange by the heat exchanger 103 using the cold water of about 6° C. produced by the refrigerating machine 101. Accordingly, the refrigerating machine 101 and the heat exchanger 103 are needed, thereby increasing a thermal energy loss, and, additionally, since two cooling water delivery lines are needed, a separate water pump must be provided to each of the lines. As a result, there is a problem in that an area occupied by the facility is increased, and a facility equipment cost is increased.

In the above-mentioned cooling system, an amount Q of heat absorbed by the cooling water from the heat source (semiconductor manufacturing apparatus 1) is represented by the following equation (1), where amount of cooling water is W, specific heat is Cw, inlet temperature is Ti, outlet temperature is TO and temperature difference between inlet and outlet is ΔT.

$$Q = W \cdot Cw \cdot (TO - Ti) = W \cdot Cw \cdot \Delta T \quad (1)$$

In the equation (1), since the specific heat Cw s constant and the temperature difference ΔT is as small s about 5° C., the amount W of cooling water must be increased so as to increase the amount Q of heat absorbed by the cooling water. Accordingly, a large amount of cooling water is needed, and there is a problem in that a power cost of the pump is increased. Additionally, since the cooling water is supplied to the cooling water coil 10 by a full operation of the pump even in a steady state, an insufficient cooling occurs when the temperature at the outlet port 12 is rapidly increases due to a rapid increase of the load during the operation of the apparatus.

Additionally, a micro vibration is generated due to an inevitable increase in the amount of cooling water flowing through a main water delivery pipe due to a large amount of cooling water flowing through the cooling pipe. If the generated micro vibration propagates the clean room structure, which is a support member of a water delivery main pipe, a bad influence is exerted on an exposure machine and a scanning electron microscope, which are sensitive to a vibration are installed in a process area. In addition to those problems, there also is a problem in that rust or corrosion occurs in the cooling pipe, the pipe, the pump and the heat exchanger through which the cooling water flows.

DISCLOSURE OF INVENTION

It is an object of the present invention to provide an improved and useful semiconductor manufacturing facility in which the above-mentioned problems are eliminated.

A more specific object of the present invention is to reduce energy consumption of a semiconductor manufacturing plant as a whole by effectively using the heat generated by semiconductor manufacturing equipment for air conditioning of the semiconductor manufacturing plant or heating materials to be used.

It is another object of the present invention to reduce an amount of cooling water used for the semiconductor manufacturing equipment so as to attempt energy saving of a pump power.

It is a further object of the present invention to simplify a cooling facility of the cooling water used for the semiconductor manufacturing equipment.

In order to achieve the above-mentioned objects, there is provided according to the present invention a semiconductor manufacturing facility characterized by:

semiconductor manufacturing equipment;

a cooling jacket unit which cools the semiconductor manufacturing equipment;

a heat recovery part which recovers heat from warmed exhaust water, which is cooling water absorbing heat passing through the cooling jacket unit and being released from said semiconductor manufacturing equipment; and a supply pipe which supplies the warmed exhaust water, which has recovers heat in said heat recovery part, to said cooling jacket unit, wherein the heat recovered by the heat recovery part is utilized as a heat source used in a semiconductor manufacturing plant.

According to the present invention, the energy consumed by the semiconductor manufacturing plant can be saved since the heat generated by the semiconductor manufacturing equipment is reused as a heat source used in the semiconductor manufacturing plant by using the cooling water as a medium. In the present invention, it is preferable to make a structure which is provided with a temperature detecting part detecting a temperature of a cooling water outlet port of the cooling jacket unit and a flow control part controlling a flow of the cooling water flowing through the cooling jacket unit so that a temperature detection value by temperature detecting part becomes equal to a setting temperature. Additionally, a structure may be used which structure is provided with a bypass passage connecting between an inlet port and an outlet port of the cooling jacket unit so as to allow a flow from the outlet port toward the inlet port by bypassing the cooling jacket unit and a flow control part provided to the bypass passage so as to control an amount of the cooling water. Further, a structure may be used which structure is provided with detecting means for detecting a temperature difference between the inlet port and the outlet port of the cooling jacket unit, and wherein an amount of the cooling water flowing through the cooling jacket unit via the flow control part provided to the bypass passage in accordance with the temperature difference detected by the detecting means. The structure in which the bypass passage is provided is particularly effective when the cooling jacket unit is a single pipe coil. Additionally, a heat exchanger for cooling the warmed exhaust water flowing through the supply pipe may be provided so as to produce the cooling water, and the cooling water exiting from the heat exchanger may be supplied to the cooling jacket unit.

Additionally, it is preferable that the cooling jacket unit has a structure having a so-called double jacket that comprises: an inner fluid passage formed so as to surround a periphery of a heat generating part of the semiconductor manufacturing equipment and having an outlet port of the cooling water; an outer fluid passage communicated with said inner fluid passage and having an inlet port of the cooling water, the outer fluid passage being formed so as to surround a periphery of the inner fluid passage and is capable of exchanging heat with the cooling water in the inner fluid passage. According to the above-mentioned structure, since the cooling water in the outer fluid passage is warmed by the cooling water in the inner fluid passage, the temperature difference between the inlet port and the outlet port of the cooling jacket unit can be increased while the temperature difference on the side of the semiconductor manufacturing equipment is suppressed to be small, thereby reducing the amount of the cooling water.

Specifically, a temperature of the cooling water supplied to the cooling jacket unit is equal to or higher than 10° C. and less than 45° C.; a temperature flowing out of the cooling jacket unit is less than 98° C.; and a temperature difference between the cooling water to be supplied to the cooling jacket unit and the cooling water flowing out of the cooling jacket unit is set equal to or greater than 35° C. It should be noted that the cooling water supplied to the cooling jacket unit preferably be deoxidized and a reducing agent is dissolved therein. According to this, a metal part such as a pipe can be prevented from being corroded. For example, hydrogen is used as the reducing agent. An amount of the dissolved hydrogen relative to the cooing water is preferably equal to or greater than 0.4 ppm. Additionally, it is preferable that surfaces of the cooling jacket unit and at least a part of an outlet port pipe from the outlet port of the cooling jacket unit to a part contacting air in a clean room are preferably covered by a heat insulator, which does not generate a gaseous contaminant.

Other objects, features and advantages of the present invention will become more apparent from the following detailed description when read in conjunction with the accompany drawings.

BEST MODE FOR CARRYING OUT THE INVENTION

Figure 3:
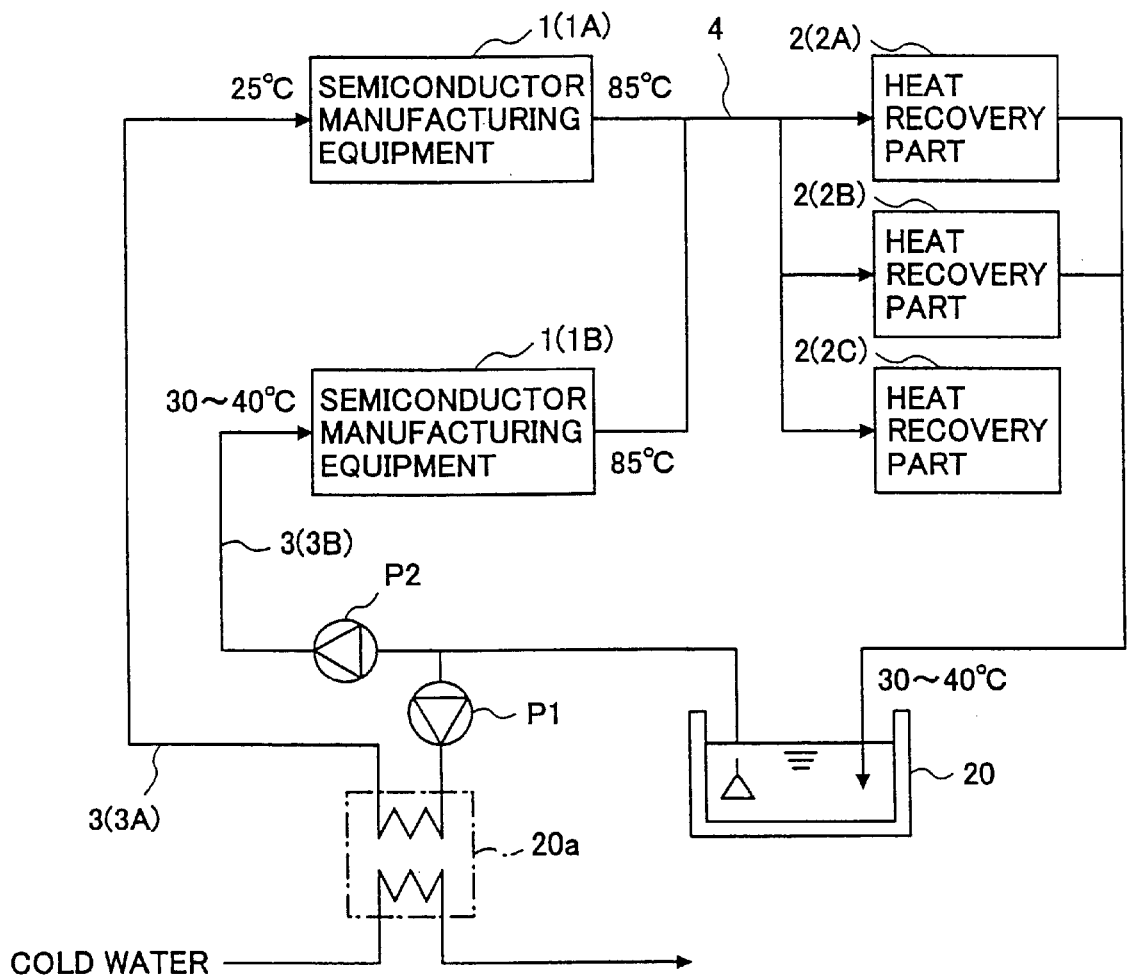
FIG. 3 is a structural diagram of a semiconductor manufacturing facility according to a first embodiment of the present invention.

A description will now be given, with reference to the drawings, of a semiconductor manufacturing facility according to a first embodiment of the present invention. FIG. 3 is a diagram showing an entire structure of the semiconductor manufacturing facility according to the first embodiment of the present invention.

In the semiconductor manufacturing facility shown in FIG. 3, cooling water is supplied to semiconductor manufacturing equipment 1 (1A, 1B) from pumps P1, P2 via supply pipes 3 (3A, 3B), respectively. The cooling water (warmed exhaust water) warmed in the semiconductor manufacturing equipment 1 (1A, 1B) is supplied to heat recovery parts 2 (2A–2C) via an outlet pipe 4 so that heat is collected from the warmed exhaust water.

The semiconductor manufacturing equipment 1 in the present embodiment is equipment which generates heat when a process of forming a semiconductor circuit on a semiconductor substrate (for example, silicon wafer) is performed. For example, the semiconductor manufacturing equipment 1 includes a processing apparatus such as a vertical heat treatment apparatus which performs a heat treatment on semiconductor substrates according to a batch method or an individual sheet type heat treatment apparatus which performs a heat treatment on a semiconductor substrate on an individual substrate basis. Besides, the semiconductor manufacturing equipment 1 includes a vacuum pump such as a turbomolecular pump or utility equipment generating heat in operation.

The heat recovery part 2 is means for collecting heat from the warmed exhaust water which heat is utilized as a heat source in a semiconductor manufacturing plant. As for the heat source from which the heat recovery part 2 collects heat, there are: a heat exchanger which performs heat exchange on warm water flowing through a warm water (boiler water) pipe for office heating, for example; the warm water itself, that is, a fluid passage part through which the warm water flows; a preheating part of an air conditioner for adjusting temperature and humidity when outside air is taken into a clean room; a heating part of an air conditioner (a part for heating humidity adjusted air after a water component is removed from outside air by cooling); a temperature adjusting part for adjusting pure water; a heat source for conditioning circulated air in a clean room; and a heat-retaining part of a low pressure vapor gas.

It should be noted that the semiconductor manufacturing plant means a plant including a clean room necessary for manufacturing semiconductor devices, a facility or office to provide utilities thereof, a warehouse, etc.

In the above-mentioned example, the warm exhaust water after the heat recovery is performed is at a temperature of, for example, 30° C. to 40° C. The warm exhaust water is temporarily stored in a water tank 20, and, then delivered to the semiconductor manufacturing equipment 1. In a case in which the semiconductor manufacturing equipment 1A is a vertical heat treatment apparatus (more specifically, a heating furnace used in the vertical heat treatment apparatus), it is necessary to supply the cooling water of which temperature is adjusted to a target temperature, for example, 25° C. in consideration of an influence to a heating temperature of a process area in the heating furnace. Accordingly, the temperature of the cooling water in the water tank 20 is adjusted by being passed through a heat exchanger 20a. Cold water, which is cooled, for example, by a refrigerating machine, is supplied to a primary side of the heat exchanger 20a.

On the other hand, in a case in which the semiconductor manufacturing equipment 1B is a turbomolecular pump, the cooling water in the water tank 31 is directly supplied to the semiconductor manufacturing equipment 1B without being passed through the heat exchanger 20a since a rough cooling can be allowed. The semiconductor manufacturing equipment is provided with a cooling jacket unit described later, although not shown in FIG. 3, and the heat of the semiconductor manufacturing equipment 1 is collected by the cooling water flowing through the unit, and the cooling water, that is, warmed exhaust water, at the outlet port becomes, for example, 85° C.

Figure 4:
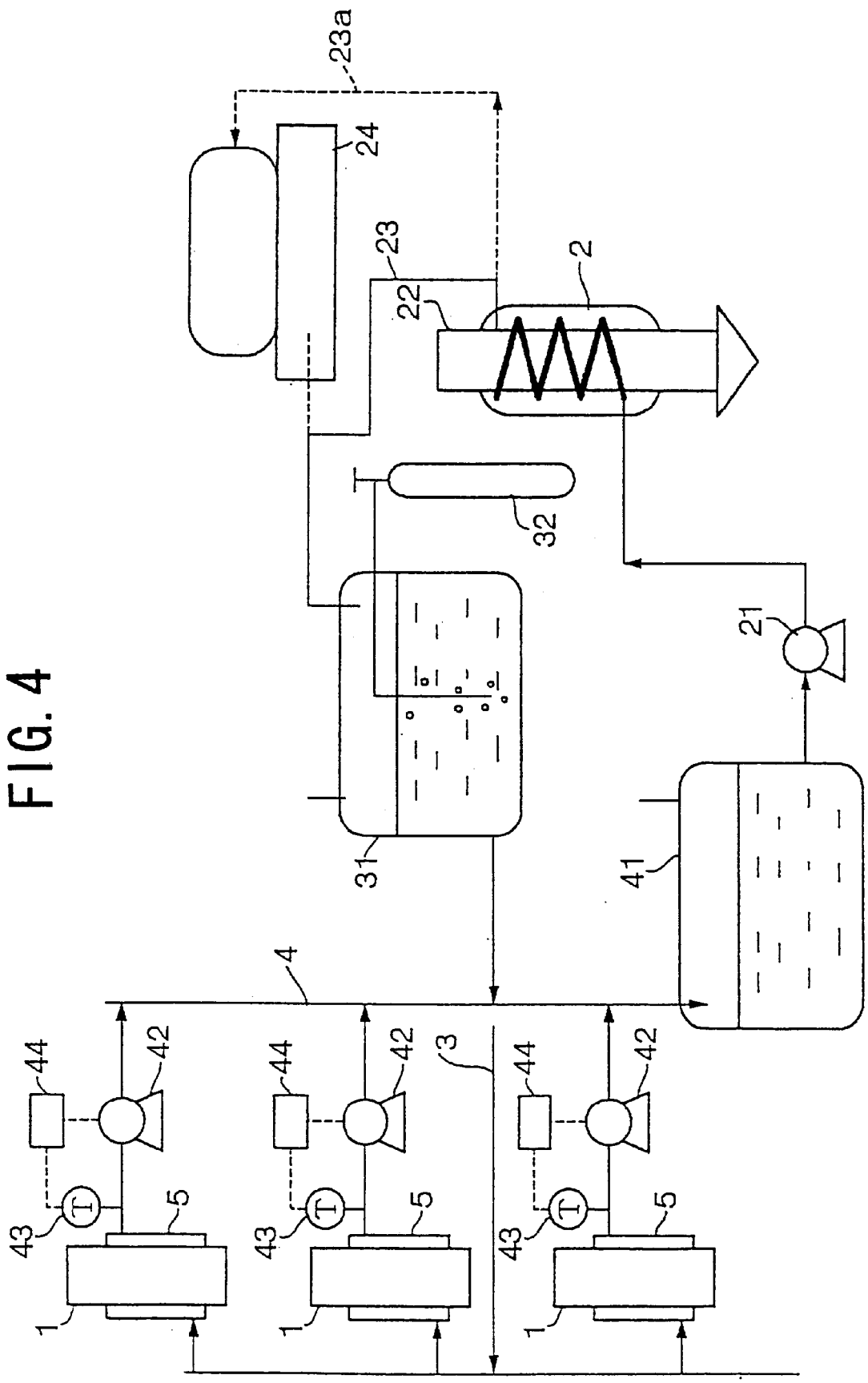
FIG. 4 is a structural diagram showing a detail of the semiconductor manufacturing facility according to the first embodiment of the present invention.

FIG. 4 is a diagram showing a detail of the structure of the semiconductor manufacturing facility according to the present embodiment. Each of three semiconductor manufacturing equipments 1 shown in FIG. 4 is a vertical heat treatment apparatus. The semiconductor manufacturing equipment 1 is provided with a cooling jacket unit 5 for cooling the semiconductor manufacturing equipment 1 (specifically, a heat generating part thereof). A description will be given below, with reference to FIGS. 5A through 8, of a preferred structural example of the cooling jacket unit 5.

Figure 5A:
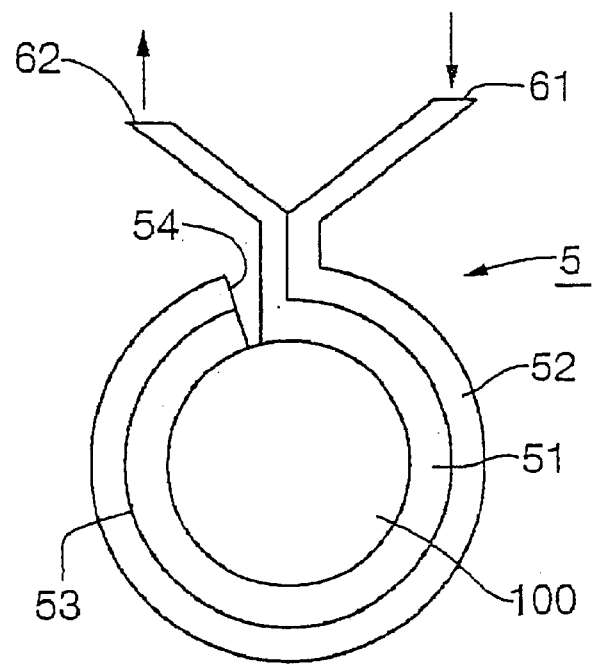
FIGS. 5A and 5B are illustrations for explaining an example of a cooling jacket unit shown in FIG. 4.

The cooling jacket unit shown in FIG. 5A has an inner fluid passage 51 and an outer fluid passage 52 formed so as to surround a periphery of the inner fluid passage 51, the inner fluid passage being formed so as to surround a heating furnace 100 of a vertical heat treatment apparatus, which is a vertical heat treatment apparatus. Each of the inner fluid passage 51 and the outer fluid passage 52 is formed as a ring-like fluid passage having a height corresponding to the heating furnace 100, and is constituted by forming a separation plate 53, which separates the inner fluid passage 51 and the outer fluid passage 52 from each other.

An inlet port 61 of cooling water is formed on a vertically lower portion of the outer fluid passage 52. A communication part 54, which connects the outer fluid passage 52 and the inner fluid passage 51 to each other, is provided at a furthest position in the outer fluid passage 52 viewed from the inlet port 61. That is, in the present embodiment, the outer fluid passage 52 is formed approximately one turn along the periphery of the heating furnace 100 in a clockwise direction in FIG. 5A from a position, as a start point, at which the inlet port 61 is formed, and is connected to the inner fluid passage 51 immediately before returning said start point. The inner fluid passage 51 is formed over approximately one turn in a counterclockwise direction in FIG. 5A from the communicating part 54 as a start point, and an outlet port 62 of the cooling water is formed on a vertically upper portion of an end point. It should be noted that although the inlet port 61 and the outlet port 62 are openings of side surfaces of the outer fluid passage 52 and the inner fluid passage 51, respectively, the inlet port 61 and the outlet port 62 are illustrated as parts slightly extending outward for the sake of convenience.

Figure 2:
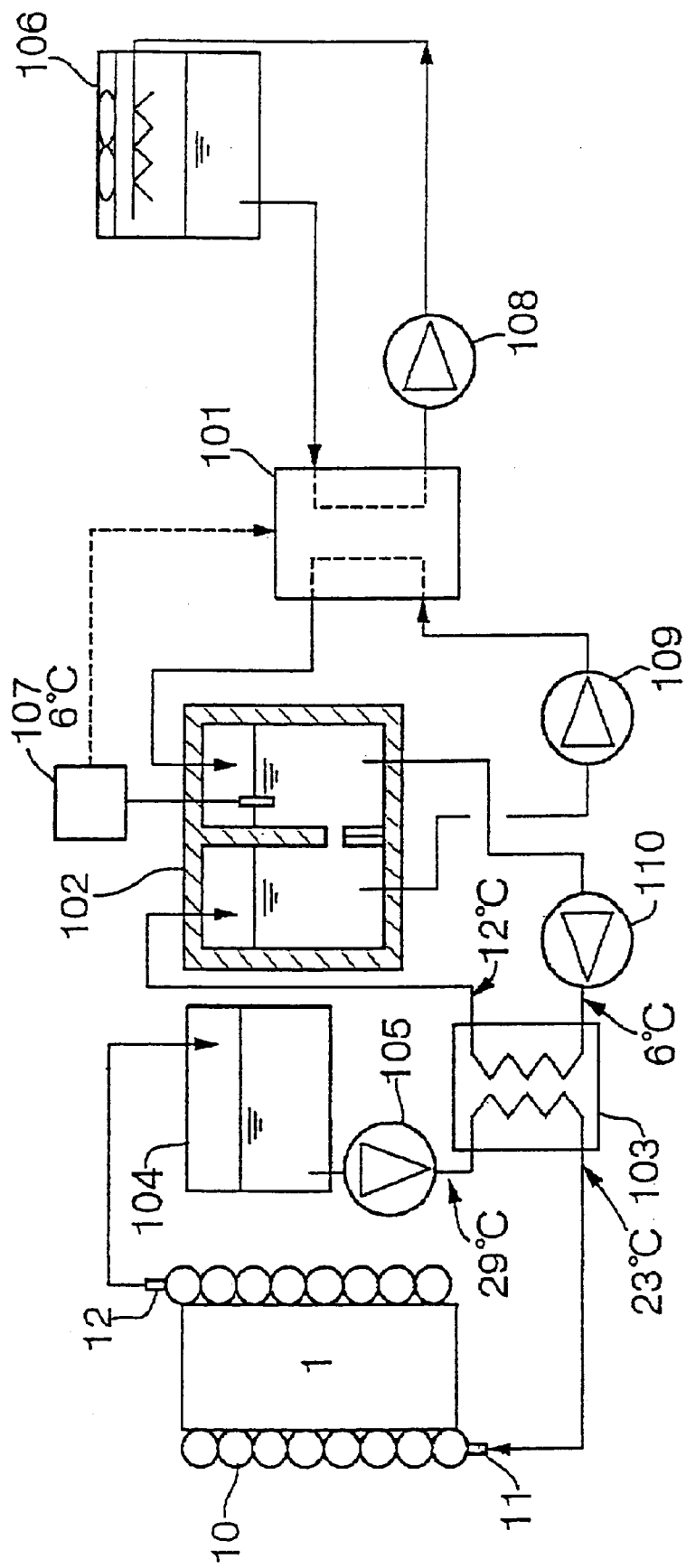
FIG. 2 is a structural diagram of a conventional cooling facility for cooling semiconductor manufacturing equipment.
Figure 5B:
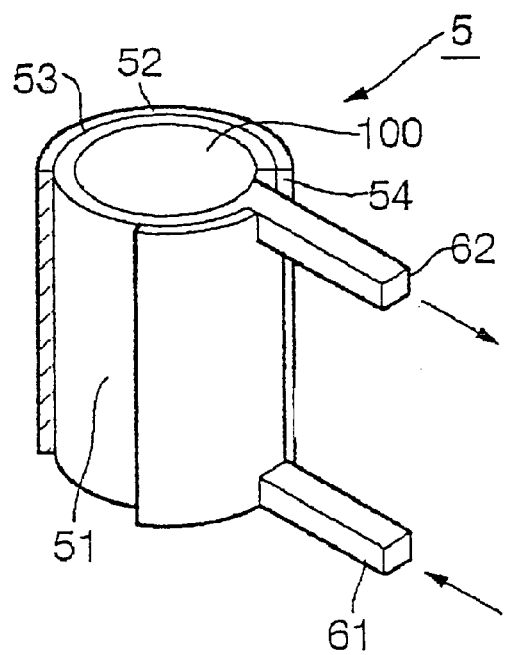

According to the above-mentioned cooling jacket unit 5, the cooling water flows from the outer inner fluid passage 52 to the inner fluid passage 51, and the heat of the heating furnace 100 transfers from the inner fluid passage 51 to the outer fluid passage via the separation wall 53. Accordingly, since the low temperature cooling water flowing in the outer fluid passage 52 is warmed by the high temperature cooling water flowing in the inner fluid passage 51, the temperature difference between the cooling water entering the inner fluid passage and the cooling water exiting from the outer fluid passage 51 is small. That is, if the cooling jacket unit 5 is the single pipe coil as shown in FIG. 2, the temperature difference between the inlet port 61 and the outlet port 62 is reflected in the temperature difference of an outer surface of the heating furnace 100. However, the cooling jacket unit 5 has the double jacket structure as shown in FIGS. 5A and 5B, the temperature difference to be reflected in the outer surface of the heating furnace 100 is reduced to the extent the cooling water in the outer fluid passage 52 being warmed.

The temperature of the cooling water at the inlet port 61 of the cooling jacket unit 5 is set to a temperature at which dew formation does not occur in the clean room forms dew since the air in the clean room is maintained at a room temperature of 23° C. and the relative humidity is maintained at 40%. In order to prevent the dew formation, the cooling water of a temperature equal to or higher than 10° C. must be supplied. On the other hand, if the temperature of the cooling water is equal to or higher than 45° C., an operator may receive a burn when the operator touches the pipe or the cooling pipe. Additionally, a protection of peripheral equipment from heat becomes insufficient. Accordingly, the temperature of the cooling water is preferably equal to or higher than 10° C. and less than 45° C.

In the present invention, there is no need to control the temperature of the cooling water to be about 23° C. by using a refrigerating machine as is in the conventional cooling water. Additionally, pure water purified by a pure water producing apparatus may be used as the cooling water, and industrial water may also be used. Further, the cooling water according to the present invention can be used as it is when the warmed exhaust water is subjected to heat recovery and the temperature thereof reaches a temperature less than 45° C. The cooling water may be used by further decreasing the temperature by a cooling tower.

In the present invention, the temperature of the outlet port of the cooling water is preferably equal to or higher than 45° C. Here, if the temperature of the outlet port of the cooling water is less than 45° C., a heat recovery efficiency by the heat exchange is low. On the other hand, if the temperature of the outlet port of the cooling water is equal to or higher than 98° C., inside the cooling pipe becomes unstable and a micro vibration is generated. Additionally, bubbles may be generated due to air in the semiconductor manufacturing environment. The reason for this is to prevent a problem in that, if the dew formation occurs in the cooling jacket unit 5 due to flow of the excessively cooled cooling water, the water generated due to the dew formation may wet a periphery or may damage the furnace generating heat.

Additionally, a mechanism is needed which can maintain the temperature of the cooling jacket unit 5 at a temperature at which a temperature condition necessary for an operation of the semiconductor manufacturing equipment is not disturbed, and automatically adjusts the temperature of the cooling water exiting the cooling jacket unit 5 to become a setting temperature at which an efficient heat recovery can be performed. The temperature at which a temperature condition necessary for an operation of the semiconductor manufacturing equipment is not disturbed is a temperature at which an interior of the semiconductor manufacturing equipment is not unnecessarily cooled by the cooling water being supplied, and desired process operations can be smoothly performed. As for such a temperature, it is preferable that a difference with respect to the temperature of the interior of the semiconductor manufacturing equipment is small. Additionally, higher the temperature, easier the heat recovery of the warmed cooling water. However, the outer side of the cooling jacket unit 5 must be a cooled state so that the purpose of cooling can be achieved, and a temperature which satisfies both must be set. Specifically, the temperature of the cooling water supplied to the cooling jacket unit 5 is preferably equal to or greater than 10° C. and less than 45° C.

If the cooling water of a temperature below 10° C. flows in a pipe or a cooling pipe, a cooling pipe in the cavitation in the flow control pump or control valve arranged after the outlet port of the cooling pipe, which may cause difficulty in the flow control.

Additionally, the temperature difference between inlet port and the outlet port of the cooling jacket unit 5 is preferably equal to or higher than 35° C. in view of a reduction of the amount of cooling water.

Considering the above-mentioned conditions, in a case in which an operating temperature of the semiconductor manufacturing equipment is several hundreds degrees, the temperature of the cooling water is preferably set in a range from about 50° C. to about 80° C. Additionally, in a case in which the operating temperature of the semiconductor manufacturing equipment is neat 1000° C., the temperature of the cooling water is preferably set in a range from 70° C. to 95° C.

On the other hand, in the conventional cooling method in which water of about 23° C. is supplied, it is said that the cooling water is cooled in excess since the temperature on the side of the cooling water is low.

Figure 6:
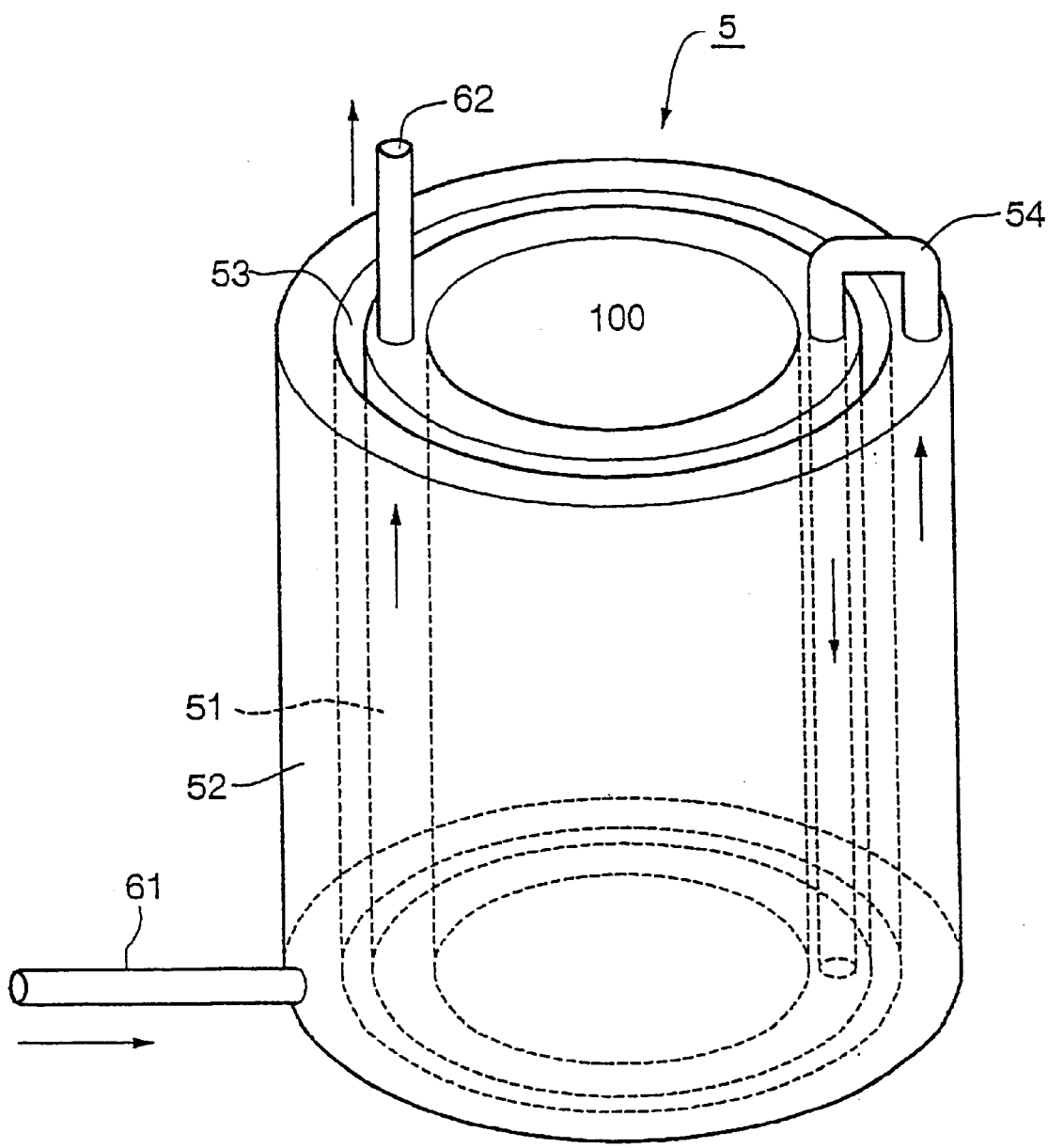
FIG. 6 is an illustration showing another example of the cooling jacket unit shown in FIG. 4.
Figure 7:
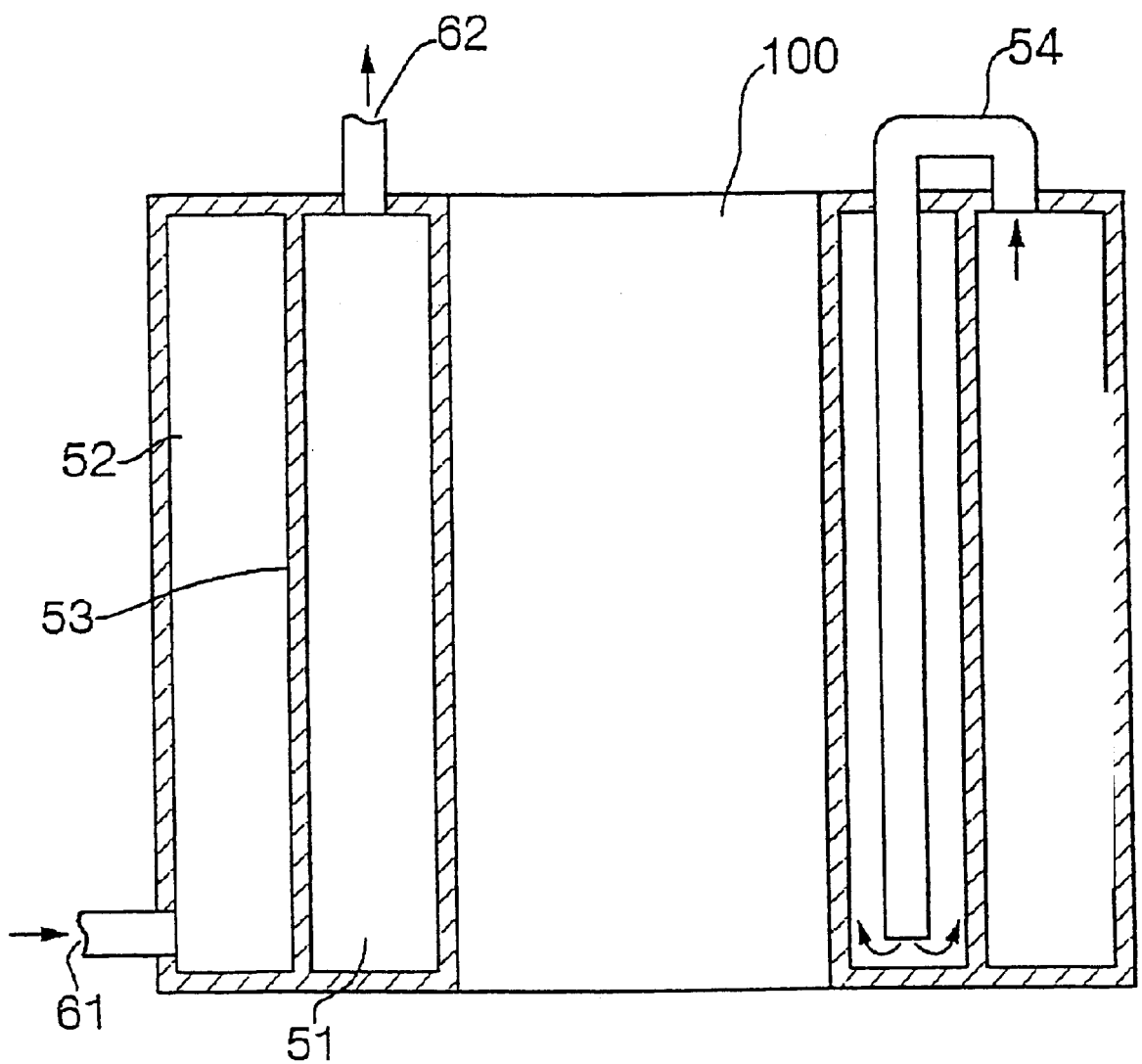
FIG. 7 is a cross-sectional view of the cooling jacket unit shown in FIG. 6.

Another example of the above-mentioned cooling jacket unit is shown in FIGS. 6 and 7. In this example, it is the same as the example of FIGS. 5A and 5B that the inner fluid passage 51 and the outer fluid passage 52 are hollow ring-like members, however, the inlet port 61 is formed on a lower part of the side surface of the outer fluid passage 52 and the outlet port 62 is formed on the top surface of the inner fluid passage 51. It should be noted that although the cooling jacket unit 5 has a double cylindrical shape, FIG. 4 illustratively shows the cooling jacket unit. The communicating part 54 is provided as a communicating pipe so as to deliver the cooling water from a position close to an upper surface of the outer fluid passage 52 to a position close to the bottom surface of the inner fluid passage 51 at a position 180 degrees different from the inlet port 61 in the circumferential direction. Additionally, the outlet port 62 is provided at a position 180 degrees shifted from the communicating part 54 in the circumferential direction. Accordingly, the cooling water flows in the inlet port 61 evenly flows to the entire outer fluid passage 52 and enters the communicating par 54. The cooling water passing through the communicating part 54 evenly flows in the entire inner fluid passage 51. The communicating part 54 is preferably provided locally as shown in FIGS. 5A through 8. The reason for this is because the cooling water flows into the outer fluid passage 52 once spreads over its entirety, and, thereafter, a flow is formed to concentrate into the inlet of the narrow communicating part 54. That is, the cooing water moves within the outer fluid passage 52 while moving in a large range, and, thereby, the uniformity in the temperature inside the outer fluid passage 52 is increased. Additionally, since the cooling water powerfully flows out of the narrow outlet of the communicating part 54 in the inner fluid passage 51 and spreads in the inner fluid passage 51, the uniformity in the temperature is also increased.

Figure 8:
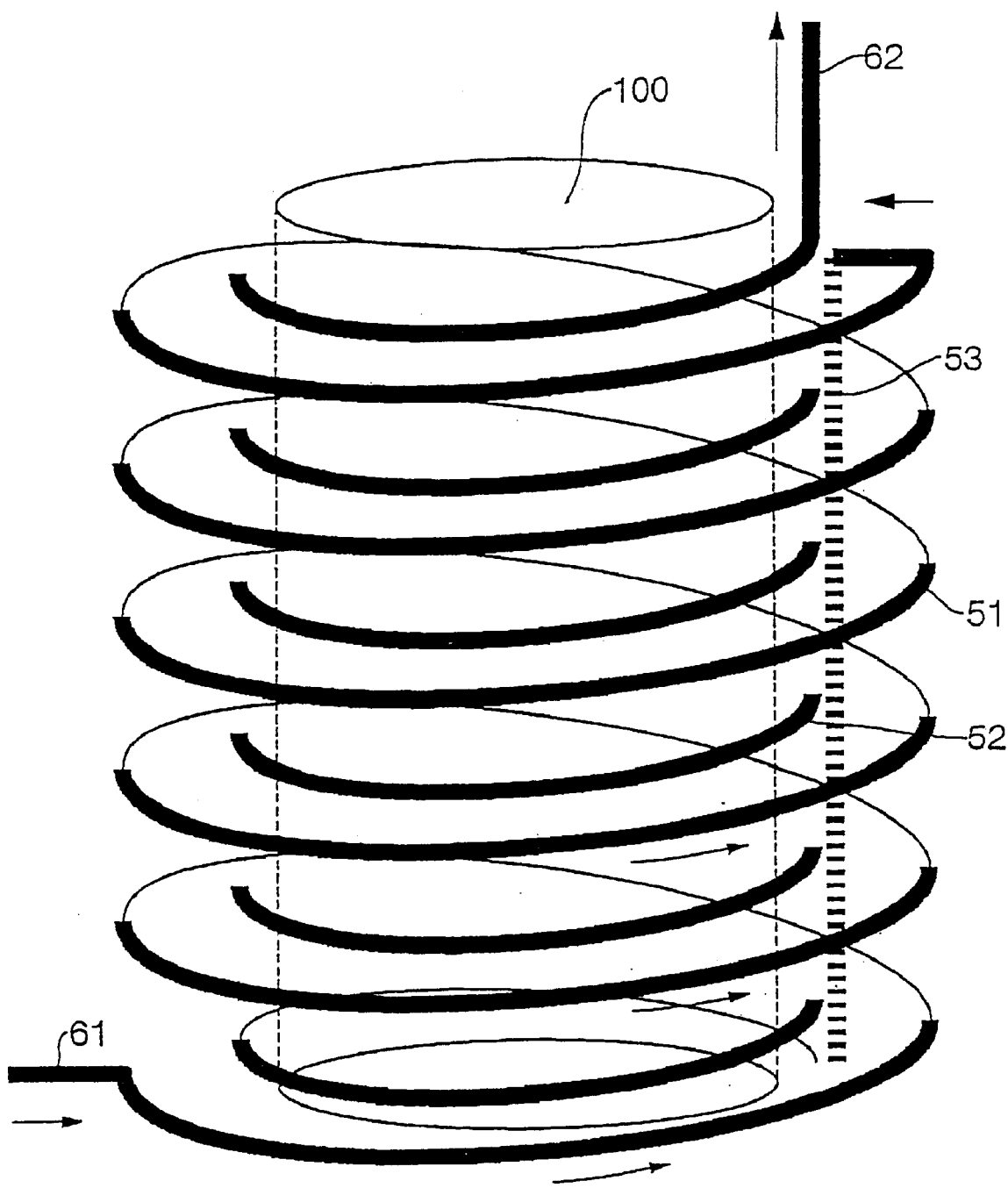
FIG. 8 is an illustration for explaining a further example of the cooling jacket unit shown in FIG. 6.

FIG. 8 is an illustration of a further example of the cooling jacket unit 5. In this example, the outer fluid passage 52 is formed in a coil-like shape along the outer surface of the heating furnace 100 upwardly from the inlet port 61 at the lower end thereof. The lower end of the inner fluid passage 51 is connected to the upper end of the outer fluid passage 52 and is formed as a coil-like shape on the outer surface of the outer fluid passage 52 extending downwardly, and the upper end thereof is the outlet port 62 of the cooling water. It should be noted that, in this example, the vertical portion connecting the upper end of the outer fluid passage 52 to the inner fluid passage 51 corresponds to the communicating part 54.

Figure 9:
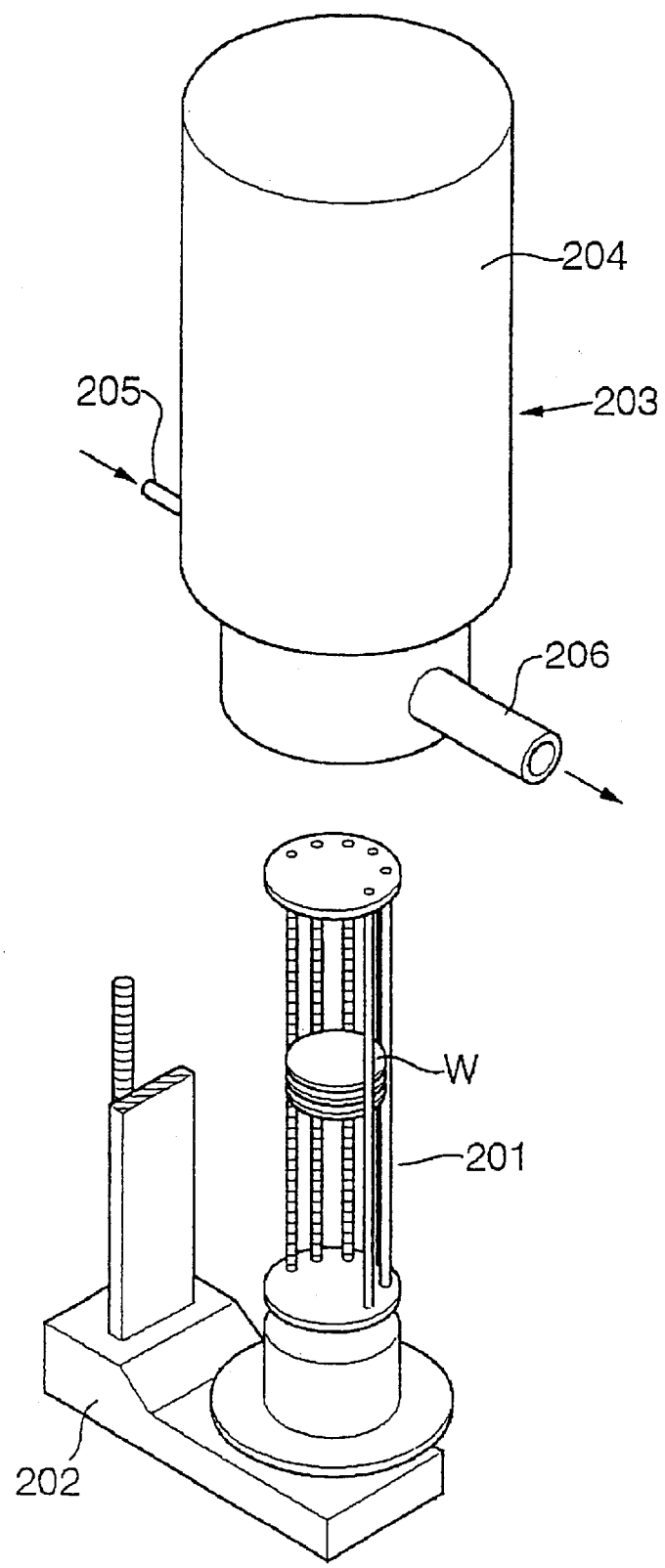
FIG. 9 is a perspective view of a vertical heat treatment apparatus provided in the semiconductor manufacturing facility according to the first embodiment of the present invention.

An outside view of the vertical heat treatment apparatus including the heating furnace 100 is shown in FIG. 9. In the vertical heat treatment apparatus, a plurality of semiconductor wafers W are supported on a support tool 201 referred to as a wafer boat. The semiconductor wafers W are carried in a heating furnace 203 by lifting the support tool 201 by a boat elevator 202, and a predetermined heat treatment is applied to the semiconductor wafers W. The heating furnace 203 is constituted by arranging a heater and an insulator around a vertical reaction tube and covering by a cylindrical outer cover 204. In the figure, 205 and 206 indicate a process gas supply pipe and an exhaust pipe, respectively.

Figure 10:
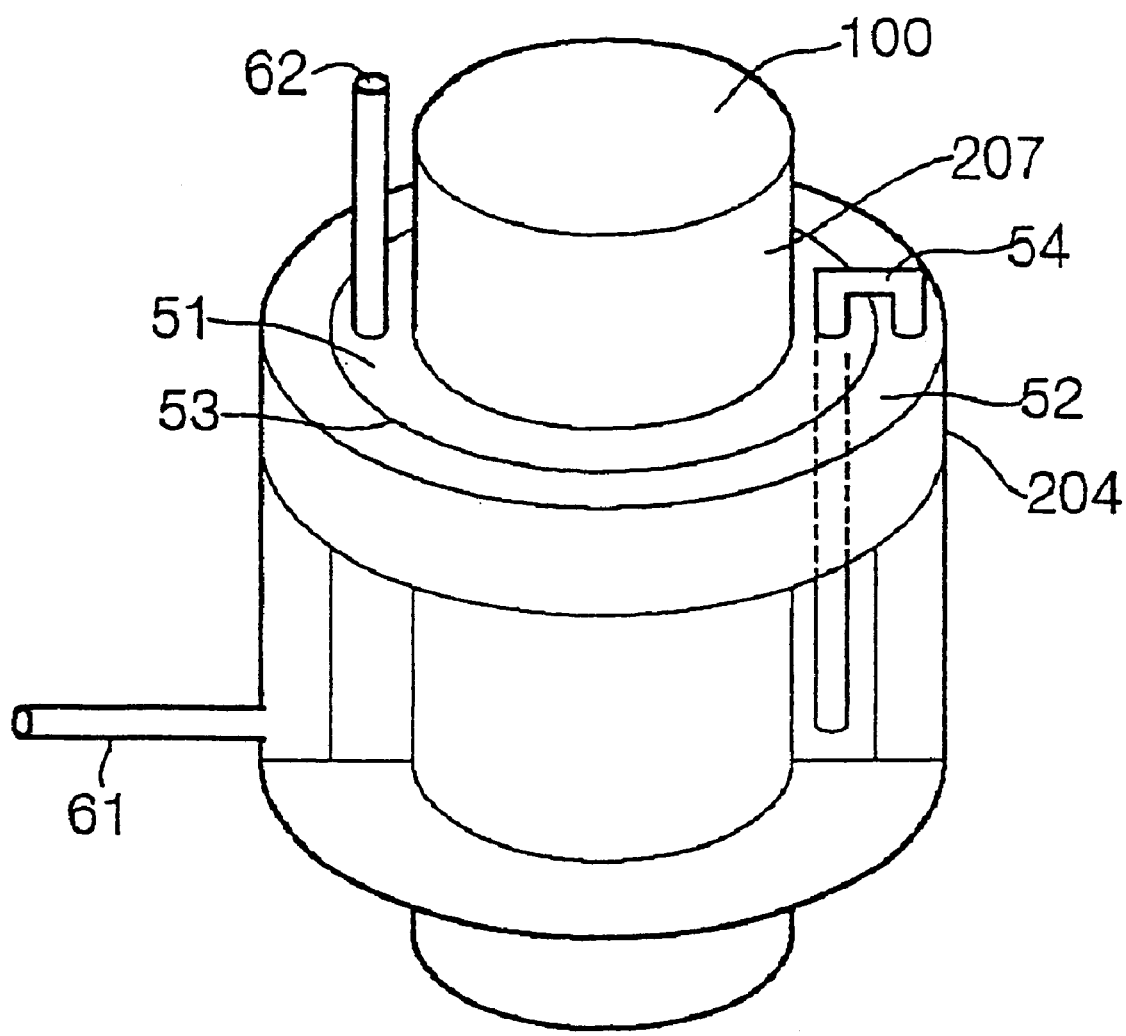
FIG. 10 is a perspective view of an yet further example of the cooling jacket unit.

Although the above-mentioned cooling jacket unit 5 is provided outside the heating furnace 203 and the outer cover 204, the cooling jacket unit 5 may be provided inside the outer cover 204 so as to be integrated with the heating furnace 203 (indicated by "100" in other figures). In an example of FIG. 10, the cooling jacket unit 5 is provided so as to surround an outer surface of an insulator 207, and the outer cover 204 is provided outside the cooling jacket unit 5.

Returning to the description of the entire structure of the embodiment shown in FIG. 4, the heat recovery apparatus according to the present embodiment comprises a cooling-water tank 31, a supply pipe 3 for supplying the cooling water in the cooling-water tank 31 to a plurality of the cooling jacket units 5 (in this case, there are three cooling jacket units 5 for the sake of convenience); an outlet pipe 4 located on the side of a fluid passage of the cooling water (warmed exhaust water) exiting from each of the cooling jacket units 5; a warmed exhaust water tank 41 for temporarily storing said warmed exhaust water; flow control pumps 42 which are flow control parts for controlling an amount of flow of the cooling water flowing in the cooling-water passage units; temperature detecting parts 43 which detect a temperature of the cooling water (warmed exhaust water) on the outlet side of each of the cooling jacket units 5; and control units 44 which control an amount of flow of the cooling water via the flow control pumps 42 base on temperature detection values of the temperature detecting parts 43.

Further, this embodiment is provided with the heat recovery part 2, and the warmed exhaust water in the warmed exhaust water tank 42 is delivered to the heat recovery part 2 by the pump 21. In the heat recovery part 2, the heat recovery part 2 is used for heating a fluid 22, for example, boiler water, used in the semiconductor manufacturing plant. The used warmed exhaust water which has been cooled by heat exchange by the heat recovery part 2 (heat exchanger) is returned to the cooling-water tank 31 via the return pipe. It should be noted that in a period when an outside temperature is high, the used warmed exhaust water may be returned to the cooling-water tank 31 after being further cooled in the cooling tower 24 through a fluid passage (return pipe 23a) as indicated by a dashed line in FIG. 4.

Additionally, in this example, hydrogen gas diluted by nitrogen gas can be introduced into the cooling water in the cooling-water tank 31 from a steel bottle 32. When the hydrogen gas is introduced into the cooling water, oxygen in the cooling water is removed by bubbling (deoxidization), and, at the same time, hydrogen is dissolved in the cooling water. A mentioned above, by deoxidization being applied to the cooling water and a reducing agent such as hydrogen being dissolved in the cooling water, corrosion of a metal constituting the pipe is suppressed.

The reducing agent is not limited to hydrogen. In this invention, the reducing agent is a material, which is water soluble and can prevent oxidation of a pipe. Normally, an inorganic material such as hydrogen, sodium thiosulfate or metal may be used. Additionally, an organic material such as sodium oxalate, sodium ascorbate or isopropyl alcohol may be used. Those chemical compounds render the oxidation-reduction voltage of water to minus (–), and has a function to prevent oxidation of a metal.

The reason for the cooling water according to the present invention suppressing the corrosion of a metal, which is in contact with the water of the cooling facility for the semiconductor manufacturing equipment, is that the cooling water does not contain dissolved oxygen and the cooling water becomes a reducing water due to the presence of hydrogen in the cooling water. That is, if the dissolved oxygen is present in the cooling water, the oxygen reducing potential becomes minus (–) 300 mV with respect to the potential of the hydrogen, which results in a reducing water. Accordingly, if the cooling water of the present invention in which hydrogen is dissolved by a concentration equal to or greater than 0.4 ppm and equal to or less than saturated solubility at the temperature of use, is used, formation of rust on inner surfaces of the piping system, the heat exchanger, the water pump and cooling pipe through which the cooling water flows can be prevented. Accordingly, generation of pinholes or pitting hole due to corrosion can be prevented. The cooling water according to the present embodiment can be applied to a usually used metal piping. Especially, the effect of a corrosion resistance and rust prevention with respect to a steel or copper piping for a cooling system is large.

The surfaces of the cooing jacket unit 5 and the outlet pipe 4 which surfaces contact the air in the clean room are covered by an insulator, which does not generate gaseous contaminants. As for the insulator, it is necessary to use an insulator, which does not generate gaseous contaminants by analyzing the insulator by a test method described later.

A description will now be given of an act of the entire embodiment shown in FIG. 4. The temperature of the cooling water in the cooling-water tank 31 is equal to or higher than 10° C. and lower than 45° C., and the cooling water enters cooling jacket unit 5 provided to an outer surface of the heating furnace provided on the semiconductor manufacturing equipment 1. The cooling water is heated to a temperature ranging from 70° C. to 95° C. by absorbing the heat released from the semiconductor manufacturing equipment 1, and, then, flows to the outlet pipe 4. At this time, each of the control units 44 controls the amount of flow of a respective one of the flow control pumps 42 based on the temperature detection value of the respective temperature detecting part 43 and a previously set setting temperature. That is, the amount of flow of the flow control pump 42 is controlled so that the temperature of the cooling water of the outlet port of each of the cooling jacket units 5 becomes the setting temperature. When the temperature detection value of the detecting part 43 is higher than the setting temperature, a rotational speed of the motor is increased by an inverter. Accordingly, the amount of delivery of the pump 42 is increased, and the temperature of the outlet side of the cooling jacket unit 5 is decreased. On the other hand, when the temperature detection value is lower than the setting temperature, the rotational speed of the motor is decreased. Accordingly, the amount of delivery of the pump 42 is deceased, and the temperature of the outlet side is increased. As mentioned above, the temperature of the cooling water on the outlet side is controlled to be the setting temperature.

It should be noted that a alternate current motor equipped with an inverter or a type, which uses a direct current motor as a drive power source and changes the motor output by adjusting a power, may be used as the pump 42. The motor speed may be changed by a gear converter or a pulley converter if measures are taken to prevent generation of dust. In the present invention, the pump 42 may be provided to the supply pipe 3 or a pump of which flow is not variable may be used. In such a case, the amount of flow may be controlled by a flow adjusting valve being provided parallel to the pump.

As mentioned above, in the present embodiment, since the cooling jacket unit 5, which cools the semiconductor manufacturing equipment 1, has a double jacket of the outer and inner sides, if the temperature difference between the cooling water at the inlet port and the outlet port is increased to more than 35° C., a degree of reflection of the temperature difference in the temperature difference of the semiconductor manufacturing equipment 1. As mentioned above, by increasing the temperature difference of the cooling water at the inlet port and the outlet port, the amount of the cooling water can be reduced, which can achieve energy saving. For example, an energy used for heating in the plant can be reduced by collecting heat from the cooling water by the heat recovery part 2, which cooling water is warmed by the semiconductor manufacturing equipment 1 and using the collected heat in the semiconductor manufacturing plant. Additionally, since the warmed exhaust water is cooled by the heat recovery, the cooling facility for the cooling water can be simplified.

A description will now be given of a case in which the heat recovery apparatus shown in FIG. 4 is practically operated.

[setting temperature of cooling water]

The amount of flow of the cooling water was controlled so that the temperature of the cooling water at the outlet port 5 of the cooling jacket unit 5 is 85° C.

[cooling water]

Pure water was used as the cooling water. Additionally, in order to reduce a corrosive action of the cooling water, the pure water was changed to hydrogen dissolved water by dissolving hydrogen in the pure water, an amount of the hydrogen being equal to or greater than 0.4% and that becomes a saturated solubility at a temperature of use. The hydrogen dissolved water was produced by using the cooling-water tank 31. Diluted hydrogen was introduced into the cooling water in the cooling-water tank 31 from the steel bottle 32 storing the diluted hydrogen which is diluted by nitrogen so as to perform deoxidization and dissolved hydrogen in the cooling water at the same time by bubbling.

[heat recovery]

The warmed exhaust water stored in the warmed exhaust water tank 41 was used to warm the air taken in the clean room so as to recover heat from the warmed exhaust water. That is, the heat exchanger 2 using the warmed exhaust water was used as an air heating apparatus. The warmed water is supplied from the warmed exhaust water tank 41 to the heat exchanger 2 by the warmed exhaust water pump 21, and outside air (5° C.) to be supplied to the clean room was supplied as the fluid 22 to be heated. The outside air was heated by the heat of the warmed water to 24° C., and the air of 24° C. was supplied to the clean room. The water after the heat recovery was returned to the cooling-water tank 31 through the warmed water returning pipes 23 and 23a. Since the outside air was 5° C., the cooling tower 24 was bypassed. The cooling tower 24 was used when the outside air is hot and humid such as summer time.

[use of insulator]

A preferable limit of an amount of gaseous organic materials generated by an organic insulator, which can be used alone, is equal to or less than 50 $\mu$g/g-specimen. According to the research by the inventors, if the amount of gaseous organic materials generated is equal to or less than this value, it was confirmed that the gaseous organic materials do not contaminate the air in the clean room. Further, the same thing happen in the amount of generation of organic materials from the protective tape to be used. In the present embodiment, polyethylene foam (analyzed value 27 $\mu$g/g-specimen) having a thickness of 20 mm was used, and a polyethylene tape (13 $\mu$g/g-specimen) was wound thereon.

[analyzing method of gaseous organic material generated from insulator]

An insulator, which does not generate gaseous organic materials, was mounted to a warmed exhaust water line, which is in contact with air in the clean room, and a protective film was wound on the insulator. The selection of the insulator and the tape was performed by the following method generally referred to as purge & trap gas chromatograph/mass spectrum (hereinafter abbreviated as P&T-GC/MS).

First, specimen of several tens milligrams was filled in a test tube, and heated at 100° C. for 30 minutes under the flow of helium, and organic components generated was trapped by a trap tube, which was cooled at −130° C. After completion of heating of the specimen, the trapped organic components were rapidly heated at 300° C. under the flow of helium, and were analyzed by being introduced into the GC/MS apparatus. The GC apparatus was the HP-5890A type of Hewlett-Packard Co. (hereinafter abbreviated as HP), and the HP-5970B type mass analyzer was used for the MS apparatus. The column of the GC apparatus was HP-Ultra 2 (OV-5), which has an inner diameter of 0.2 mm, a length of 25 m and a film thickness of 0.33 $\mu$m.

initial temperature 40° C.→temperature up (10° C./min.)
→final temperature 300° C. (maintain for 150 min.)

The carrier gas was helium, and a split method was used for the injecting method. The sprit ratio was 1/200. The ionizing method of MS was an electron bombardment method, and detection range was 25 to 1000 m/z.

[method for measuring organic contaminant in clean room]

When the measurement of organic contaminant in the clean room was performed, a silicon wafer on which an oxidation film is deposited was exposed in the air in the clean room for 24 hours. The wafer after exposure was put in a wafer heating removal apparatus (silicon analyzer manufactured by GL Science Co.) instead of the above-mentioned purge & trap, and analysis and measurement was taken by the above-mentioned GC/MA method after the adsorbed organic materials were removed by heating.

[effects of the present embodiment]

(1) Cooling Effect of the Semiconductor Manufacturing Equipment

With respect to the object to maintain the surface of the semiconductor manufacturing equipment at a normal temperature, which is an original object of the cooling, a cooling effect the same as that of the conventional coil type cooling pipe was achieved. That is, since the temperature of the outer fluid passage 52 of the cooling jacket unit 5 was a normal temperature by use of the cooling jacket unit 5 of a double tube type, the operator did not receive a burn when touching the cooling jacket unit 5 and did not thermally deteriorate other apparatuses and facilities (2) Effect of Reduction of Apparatus In the present embodiment, it is a largest feature that the refrigerating machine provided in the conventional cooling facility shown in FIG. 2 is omitted. Additionally, the pump, the heat exchanger and the pipe, which are necessary for the refrigerating machine, have become unnecessary, and it was able to attempt energy saving.

(3) Electric Power Consumption

The amount of electric power consumption was equal to or less than 1/10 of the conventional one due to the refrigerating machine was unnecessary. Further, the temperature difference ΔT between the inlet port temperature Ti and the outlet port temperature T0 in the equation (1) was able to be set to equal to or greater than 30° C., it was able to reduce the amount W of the cooling water to be equal to or less than 1/10 of the conventional one. Accordingly, it was able to operate the water pump by a power equal to or less than 1/10 of that of the conventional one. Additionally, diameters of the cooling-water pipes were able to be reduced to equal to or less than 1/3, and a weight of the pipes was able to be reduced. As mentioned above, the cooling method using the heat recovery apparatus according to the present invention provided a great effect in respect to electric power saving and energy saving.

(4) Control of a Micro Vibration

A micro vibration due to flow of the cooling water in the water pump/pipe system was able to be reduced to about one half. In the experiments, the micro vibration was reduced to 20% of the micro vibration in the conventional pipe system.

(5) Energy Saving by Heat Recovery

Heat was collected by using the warmed exhaust water stored in the warmed exhaust water tank so as to arm the outside air to be supplied to the clean room. Thereby, it was able to reduce a heating cost particularly during a low temperature period.

(6) Effect of Preventing Corrosion by Cooling Water

Hydrogen was dissolved in the cooling water by a concentration equal to or greater that 0.4 ppm and less than a saturated solubility at a temperature of use. An inspection was performed a half year later, and there was not corrosion or rust found.

(7) Measures for Outgas of Insulator

An analysis was performed by using the above-mentioned wafer heating removal GC/MS method by exposing wafers to air in the clean room using an insulator, and there was no increase found in the amount of organic materials.

Figure 1A:
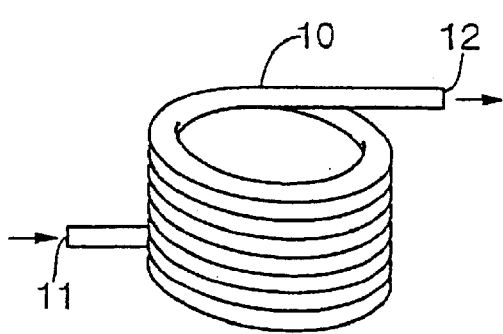
FIG. 1A is a perspective view of a single coil-type cooling jacket unit.
Figure 1B:
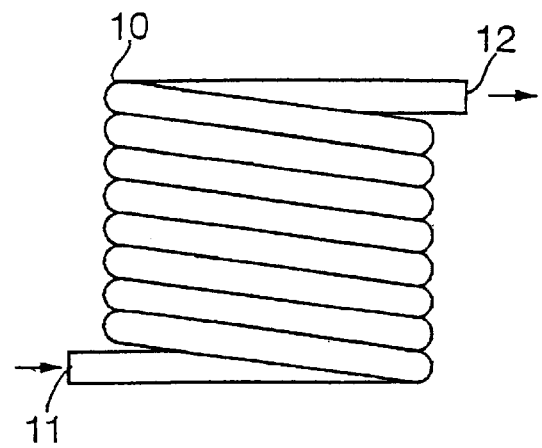
FIG. 1B is a front view of the single coil-type cooling jacket unit.

In the above mentioned embodiment, the conventionally used single coil cooling pipe shown in FIGS. 1A and 1B may be used instead of the cooling jacket unit having a double jacket. However, in a regular cooling pipe, if the outlet temperature is set to a temperature, at which a heat recovery can be performed, with respect to the inlet temperature, the temperature difference therebetween is increased, and there are problems in that the temperature inside the semiconductor manufacturing equipment becomes uneven and an amount of thermal distortion of the cooling pipe itself is increased. Accordingly, the temperature difference between the inlet temperature and the outlet temperature must be decreased.

Figure 11:
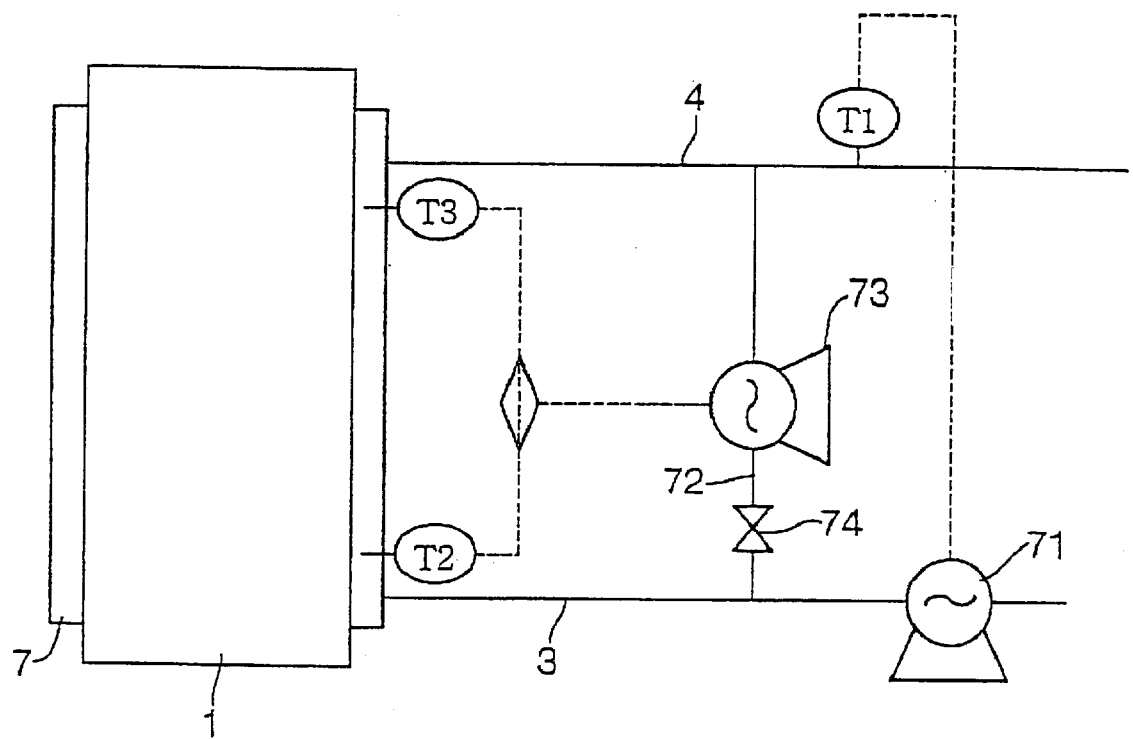
FIG. 11 is a diagram showing a structure of a part of a semiconductor manufacturing facility according to a second embodiment of the present invention.

FIG. 11 is a diagram showing a part of a structure of a semiconductor manufacturing facility according to a second embodiment of the present invention. In FIG. 11, a single coil type cooling jacket unit 7 is used as the cooling jacket unit. The supply pipe 3 is provided with a pump 71 which constitutes the flow control part, and a bypass pipe 72 is provided between the outlet side of the pump 71 and the outlet pipe, the bypass pipe 72 returning a part of the cooling water exiting from the cooling jacket unit 7 to the inlet side of the cooling jacket unit 7. The bypass pipe 72 is provided with a pump 73, which constitutes a flow control part. A check valve 74 (a valve which prevent a flow from the supply pipe 3 toward the outlet pipe 4) is provided to the outlet side of the pump 73 so that the cooling water from the pump 71 does not flow to the bypass pipe 72. As for the pumps 71 and 73, a variable flow pump such as a pump driven by an alternate current motor equipped with an inverter may be used.

Additionally, in the present embodiment, there are provided temperature detecting parts T1, T2 and T3, the temperature detecting parts T1 detecting the temperature of the cooling water on the downstream side of a branch point of the bypass pipe 72 at the outlet pipe 4, the temperature detecting parts T2 and T3 detecting the temperature of the cooling water near the inlet port (inlet side) and the outlet port (outlet side) of the cooling jacket unit 7, respectively. It should be noted that, in the following description, T1 to T3 mean reference numerals indicating the temperature detecting parts, and also mean the temperature detection values detected by the temperature detecting parts. The amount of delivery of the pump 71 is controlled based on T1 and the setting temperature so that T1 becomes equal to the setting temperature. The amount of delivery of the pump 73 is controlled so that the temperature difference between T2 and T3 becomes equal to a setting value (for example, the temperature difference of 40° C.). In the figure, although T1, T2, T3 and the pumps 72 and 73 are connected by dashed lines, a control part not shown in the figure is interposed therebetween in practice.

In the present embodiment, when T1 is increased, the output of the pump 71 is increased and the amount of the cooling water is increased, thereby acting to decrease the temperature of the outlet side of the cooling jacket unit 7. On the other hand, when T1 is decreased, the output of the pump 71 is decreased and the amount of the cooling water is decreased, thereby acting to increase the temperature of the outlet side of the cooling jacket unit 7.

Additionally, when the temperature difference between T2 and T3 is increased, the output of the pump 73 of the bypass pipe 72 is increased and the amount of the cooling water returned from the outlet side of the cooling jacket unit 7 is increased so as to decrease the temperature difference. On the contrary, when the temperature difference between T2 and T3 is decreased, the flow of the pump 73 is reduced and an amount of return is decreased. As mentioned above, the temperature of the warmed exhaust water and the temperature difference between the inlet port and the outlet port of the cooling jacket unit 7 can be controlled to predetermined values. As a result, the warmed exhaust water suitable for heat recovery can be obtained and the temperature difference between the upper portion and lower portion of the cooling jacket unit 7 can be decreased. Thereby, an influence to the temperature inside the semiconductor manufacturing equipment due to the temperature difference in the cooling jacket unit can be suppressed. Additionally, an amount of distortion due to expansion and compression of the cooling pipe, which is generated by the temperature difference in the cooling pipe, can also be reduced, and there is no need to make the structure of the cooling pipe unnecessarily rigid.

Figure 12:
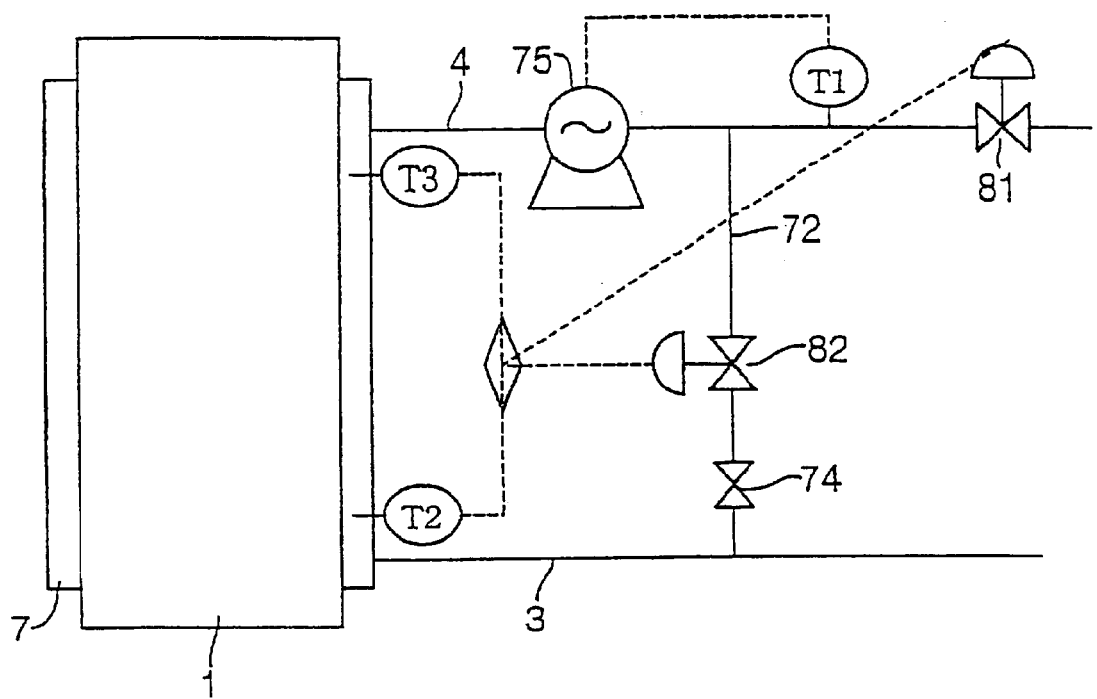
FIG. 12 is a diagram showing a structure of a part of a semiconductor manufacturing facility according to a third embodiment of the present invention.

FIG. 12 is a diagram of a structure of a semiconductor manufacturing facility according to a third embodiment of the present invention. In a heat recovery apparatus shown in FIG. 12, a variable flow pump 75 whose amount of flow is controlled based on T1 is provided on the upstream side of the bypass pipe 72 at the outlet pipe 4, and flow adjusting valves 81 and 82 are provided to the outlet pipe 4 on the downstream side of a connecting point of the bypass pipe 72 and the bypass pipe 72, respectively, so as to control the amount of flow by adjusting an opening degree of the flow adjusting valves 81 and 82. In this case, when T1 is increased higher than the setting temperature, the amount of delivery of the pump 75 is increased, and the outlet temperature of the cooling jacket unit 7 is decreased. When T1 is decreased lower than the setting temperature, the amount of delivery of the pump 75 is decreased, and the outlet temperature of the cooling jacket unit 7 is increased. Additionally, when the temperature difference between T2 and T3 is decreased, an opening degree of the flow adjusting valve 82 is reduced which results in a decrease in the amount of the cooling water flowing through the bypass pipe 72. When the temperature difference between T2 and T3 is increased, the opening degree of the flow adjusting valve 82 is increased which results in an increase in the amount of the cooling water flowing through the bypass pipe 72.

An opening degree of the flow adjusting valve 81 provided to the outlet pipe 4 is controlled to be slightly increased when the opening degree of the flow adjusting valve 82 is reduced, and is controlled to be slightly decreased when the opening degree of the flow adjusting valve 82 is increased. Also in the present embodiment, the temperature of the warmed exhaust water and said temperature difference can be controlled to predetermined values.

Figure 13:
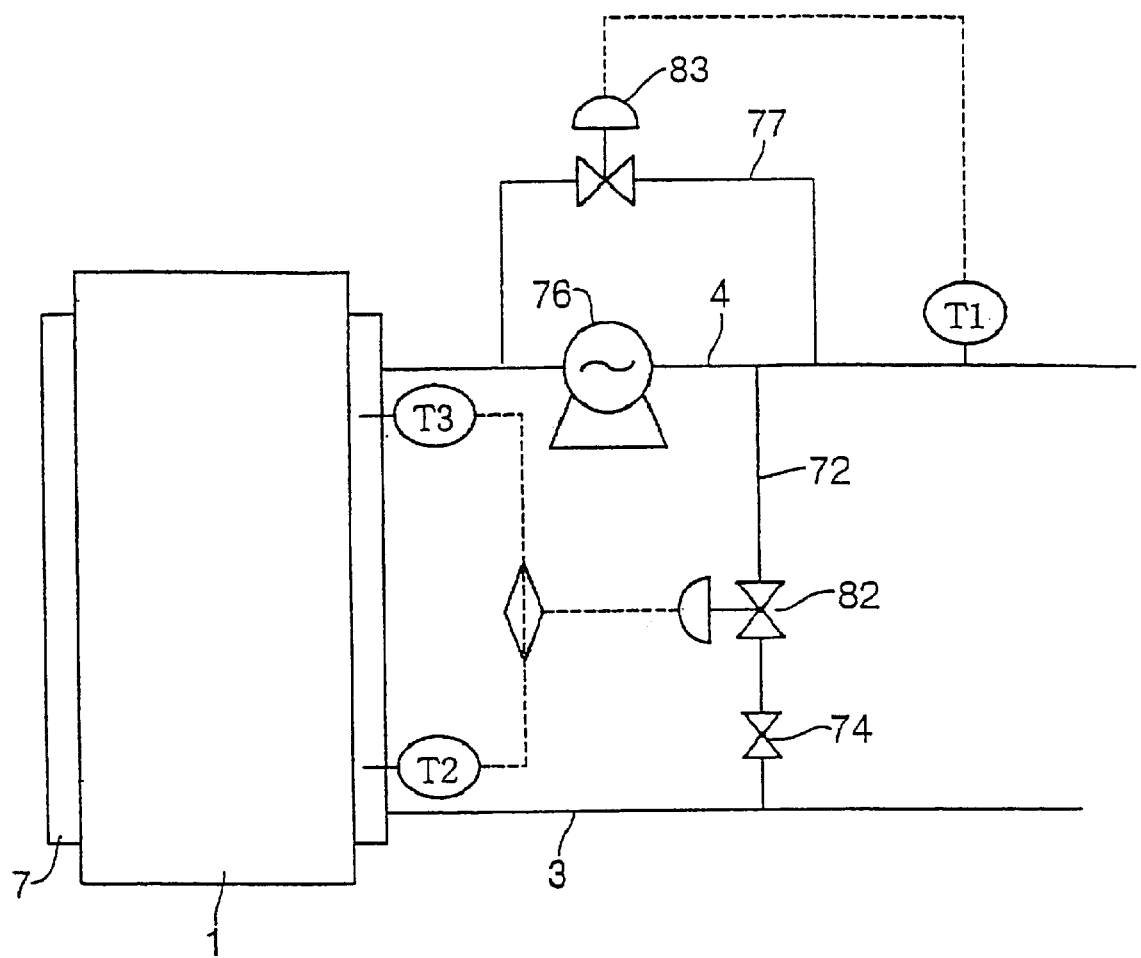
FIG. 13 is a diagram showing a structure of a part of a semiconductor manufacturing facility according to a fourth embodiment of the present invention.

FIG. 13 shows a diagram of a structure of a semiconductor manufacturing facility according to a fourth embodiment of the present invention. In a heat recovery part shown in FIG. 13, a pump 76 whose flow cannot be changed is used instead of the variable flow pump used in the above embodiment, and a bypass pipe 77, which bypasses the pump 76, is provided between the upstream side of the pump 76 and the downstream side of the connecting point of the bypass pipe 72 at the outlet pipe 4, and a flow adjusting valve 83 is provided to the bypass pipe 77. It should be noted that if the pipe between the pump 76 and the warmed exhaust water tank is short, the flow adjusting valve 81 is preferable provided to the outlet pipe 4 as in the embodiment of FIG. 12.

In the present embodiment, an amount of flow of the flow adjusting valve 83 is adjusted by T1. That is, when T1 is higher than the setting temperature, an opening degree of the flow adjusting valve 83 is increased and the amount of the cooling water flowing through the cooling jacket unit 7 is increased, and, thereby, the outlet temperature of the cooling jacket unit 7 is decreased. When T1 is lower than the setting temperature, an opening degree of the flow adjusting valve 83 is decreased and the amount of the cooling water is decreased, and, thereby, the outlet temperature is increased. Also in the present embodiment, the temperature of the warmed exhaust water and said temperature difference can be controlled to predetermined values.

It should be noted that in a case in which the cooling jacket unit 5 having a double jacket is used, the structures shown in FIGS. 11 to 13 may be adopted.

As mentioned above, according to the present invention, since the heat generated by the semiconductor manufacturing equipment is collected so as to supply as a heat energy used in the semiconductor manufacturing plant, energy saving can be achieved in the semiconductor manufacturing plant.

The present invention is not limited to the specifically disclosed embodiments, and variations and modifications may be made without departing from the scope or the present invention.

What is claimed is:

1. A semiconductor manufacturing facility characterized by:

semiconductor manufacturing equipment (1);

a cooling jacket unit (5; 7) which cools the semiconductor manufacturing equipment (1);

a heat recovery part (2) which recovers heat from warmed exhaust water, which is cooling water absorbing heat passing through the cooling jacket unit (5; 7) and being released from said semiconductor manufacturing equipment (1); and a supply pipe (3) which supplies the warmed exhaust water, which has recovers heat in said heat recovery part (2), to said cooling jacket unit (5; 7), wherein the heat recovered by said heat recovery part (2) is utilized as a heat source used in a semiconductor manufacturing plant.

2. The semiconductor manufacturing facility as claimed in claim 1, characterized by comprising: a temperature detecting part (43) detecting a temperature of a cooling water outlet port of said cooling jacket unit (5; 7); and a flow control part (44) controlling a flow of the cooling water flowing through the cooling jacket unit (5; 7) so that a temperature detection value by temperature detecting part becomes equal to a setting temperature.

3. The semiconductor manufacturing facility as claimed in claim 1 or 2, characterized by comprising:

a bypass passage (72) connecting between an inlet port and an outlet port of the cooling jacket unit (7) so as to allow a flow from the outlet port toward the inlet port by bypassing the cooling jacket unit (7); and a flow control part (73) provided to the bypass passage (72) so as to control an amount of the cooling water.

4. The semiconductor manufacturing facility as claimed in claim 3, characterized by comprising detecting means (T2, T3) for detecting a temperature difference between the inlet port and the outlet port of said cooling jacket unit (7), and wherein an amount of the cooling water flowing through said cooling jacket unit (7) via said flow control part (73) provided to said bypass passage (72) in accordance with the temperature difference detected by the detecting means.

5. The semiconductor manufacturing facility as claimed in claim 1 or 2, characterize by comprising a heat exchanger (20a) for cooling the warmed exhaust water flowing through the supply pipe (3) so as to produce the cooling water, and wherein the cooling water exiting from the heat exchanger is supplied to said cooling jacket unit (5; 7).

6. The semiconductor manufacturing facility as claimed in claim 1 or 2, characterized in that said cooling jacket unit comprises:

an inner fluid passage (51) formed so as to surround a periphery of a heat generating part of the semiconductor manufacturing equipment (1) and having an outlet port (62) of the cooling water;

an outer fluid passage (52) communicated with said inner fluid passage (51) and having an inlet port (61) of the cooling water, the outer fluid passage being formed so as to surround a periphery of the inner fluid passage and is capable of exchanging heat with the cooling water in the inner fluid passage (51).

7. The semiconductor manufacturing facility as claimed in claim 1 or 2, characterized in that: a temperature of the cooling water supplied to said cooling jacket unit (5; 7) is equal to or higher than 10° C. and less than 45° C.; a temperature flowing out of said cooling jacket unit (5; 7) is less than 98° C.; and a temperature difference between the cooling water to be supplied to said cooling jacket unit (5; 7) and the cooling water flowing out of said cooling jacket unit (5; 7) is set equal to or greater than 35° C.

8. The semiconductor manufacturing facility as claimed in claim 1 or 2, characterized in that the cooling water supplied to said cooling jacket unit (5; 7) is deoxidized and a reducing agent is dissolved therein.

9. The semiconductor manufacturing facility as claimed in claim 8, characterized in that the reducing agent is hydrogen, and an amount of the dissolved hydrogen relative to the cooling water is equal to or greater than 0.4 ppm.

10. The semiconductor manufacturing facility as claimed in claim 1 or 2, characterized in that surfaces of said cooling jacket unit (5; 7) and at least a part of an outlet port pipe from the outlet port (62) of the cooling jacket unit to a part contacting air in a clean room are covered by a heat insulator which does not generate a gaseous contaminant.

* * * * *